(12) United States Patent
Oganesian et al.

(10) Patent No.: US 9,219,091 B2
(45) Date of Patent: Dec. 22, 2015

(54) LOW PROFILE SENSOR MODULE AND METHOD OF MAKING SAME

(71) Applicant: Optiz, Inc., Palo Alto, CA (US)

(72) Inventors: Vage Oganesian, Sunnyvale, CA (US); Zhenhua Lu, East Palo Alto, CA (US)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 14/200,158

(22) Filed: Mar. 7, 2014

(65) Prior Publication Data

US 2014/0264692 A1 Sep. 18, 2014

Related U.S. Application Data

(60) Provisional application No. 61/778,238, filed on Mar. 12, 2013.

(51) Int. Cl.
H01L 27/146 (2006.01)

(52) U.S. Cl.
CPC .... *H01L 27/14625* (2013.01); *H01L 27/14618* (2013.01); *H01L 27/14685* (2013.01); *H01L 2224/10* (2013.01)

(58) Field of Classification Search
None
See application file for complete search history.

(56) References Cited

U.S. PATENT DOCUMENTS

| | | | |
|---|---|---|---|
| 6,166,784 A | 12/2000 | Murata et al. |
| 6,777,767 B2 | 8/2004 | Badehi |
| 6,972,480 B2 | 12/2005 | Zilber et al. |
| 7,033,664 B2 | 4/2006 | Zilber et al. |
| 7,157,742 B2 | 1/2007 | Badehi |
| 7,192,796 B2 | 3/2007 | Zilber et al. |
| 7,265,440 B2 | 9/2007 | Zilber et al. |
| 7,459,729 B2 | 12/2008 | Yang et al. |
| 7,495,341 B2 | 2/2009 | Zilber et al. |
| 7,642,629 B2 | 1/2010 | Zilber et al. |
| 7,683,975 B2 | 3/2010 | Kageyama |

(Continued)

FOREIGN PATENT DOCUMENTS

| | | |
|---|---|---|
| JP | 2004-289423 | 10/2004 |
| KR | 10-2004-0060733 | 7/2004 |

(Continued)

OTHER PUBLICATIONS

U.S. Appl. No. 13/157,193, filed Jun. 9, 2011, Oganesian, Vage.

(Continued)

*Primary Examiner* — Bilkis Jahan
*Assistant Examiner* — Kevin Quinto
(74) *Attorney, Agent, or Firm* — DLA Piper LLP (US)

(57) ABSTRACT

A host substrate assembly includes a first substrate with opposing first and second surfaces, an aperture extending therethrough, circuit layers, and first contact pads electrically coupled to the circuit layers. A sensor chip includes a second substrate with opposing first and second surfaces, a plurality of photo detectors formed on or in the second substrate and configured to receive light incident on the second substrate first surface, and a plurality of second contact pads formed at the second substrate first or second surfaces and are electrically coupled to the photo detectors. A spacer is mounted to the second substrate first surface. A protective substrate is mounted to the spacer and disposed over the photo detectors. Electrically conductive conduits each extend through the spacer and are in electrical contact with one of the second contact pads. Electrical connectors electrically connect the first contact pads and the conduits.

23 Claims, 15 Drawing Sheets

(56) References Cited

U.S. PATENT DOCUMENTS

| | | |
|---|---|---|
| 7,859,033 B2 | 12/2010 | Brady |
| 7,986,178 B2 | 7/2011 | Lynch |
| 2004/0251525 A1 | 12/2004 | Zilber |
| 2005/0104179 A1 | 5/2005 | Zilber |
| 2005/0205977 A1 | 9/2005 | Zilber |
| 2005/0225877 A1 | 10/2005 | Tang |
| 2007/0138498 A1 | 6/2007 | Zilber |
| 2007/0190691 A1 | 8/2007 | Humpston |
| 2007/0190747 A1 | 8/2007 | Humpston |
| 2007/0268417 A1 | 11/2007 | Kato et al. |
| 2007/0279365 A1 | 12/2007 | Kageyama |
| 2007/0279539 A1 | 12/2007 | Suzuki et al. |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0088756 A1 | 4/2008 | Tseng et al. |
| 2008/0099900 A1 | 5/2008 | Oganesian |
| 2008/0099907 A1 | 5/2008 | Oganesian |
| 2008/0116544 A1 | 5/2008 | Grinman |
| 2008/0116545 A1 | 5/2008 | Grinman |
| 2008/0150121 A1 | 6/2008 | Oganesian |
| 2008/0157312 A1 | 7/2008 | Yang et al. |
| 2008/0225404 A1 | 9/2008 | Tang |
| 2008/0239136 A1 | 10/2008 | Kanai et al. |
| 2008/0246136 A1 | 10/2008 | Haba et al. |
| 2008/0296714 A1 | 12/2008 | Yuan et al. |
| 2009/0021823 A1 | 1/2009 | Heim et al. |
| 2009/0115047 A1 | 5/2009 | Haba |
| 2009/0128922 A1 | 5/2009 | Justis et al. |
| 2009/0160065 A1 | 6/2009 | Haba |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |
| 2013/0249031 A1* | 9/2013 | Oganesian .................. 257/432 |

FOREIGN PATENT DOCUMENTS

| | | |
|---|---|---|
| KR | 10-2011-0115165 | 10/2011 |
| KR | 10-2013-0010847 | 1/2013 |
| TW | 200834938 | 8/2008 |
| TW | 200847418 | 12/2008 |
| TW | 200849507 | 12/2008 |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
Korean Office Action dated Apr. 17, 2015 corresponding to the related Korean Patent Application No. 10-2014-0028500. (English and Korean translations).
Taiwanese Office Action dated Jul. 15, 2015 corresponding to the related Taiwanese Patent Application No. 103108371. (Taiwanese translations).

* cited by examiner

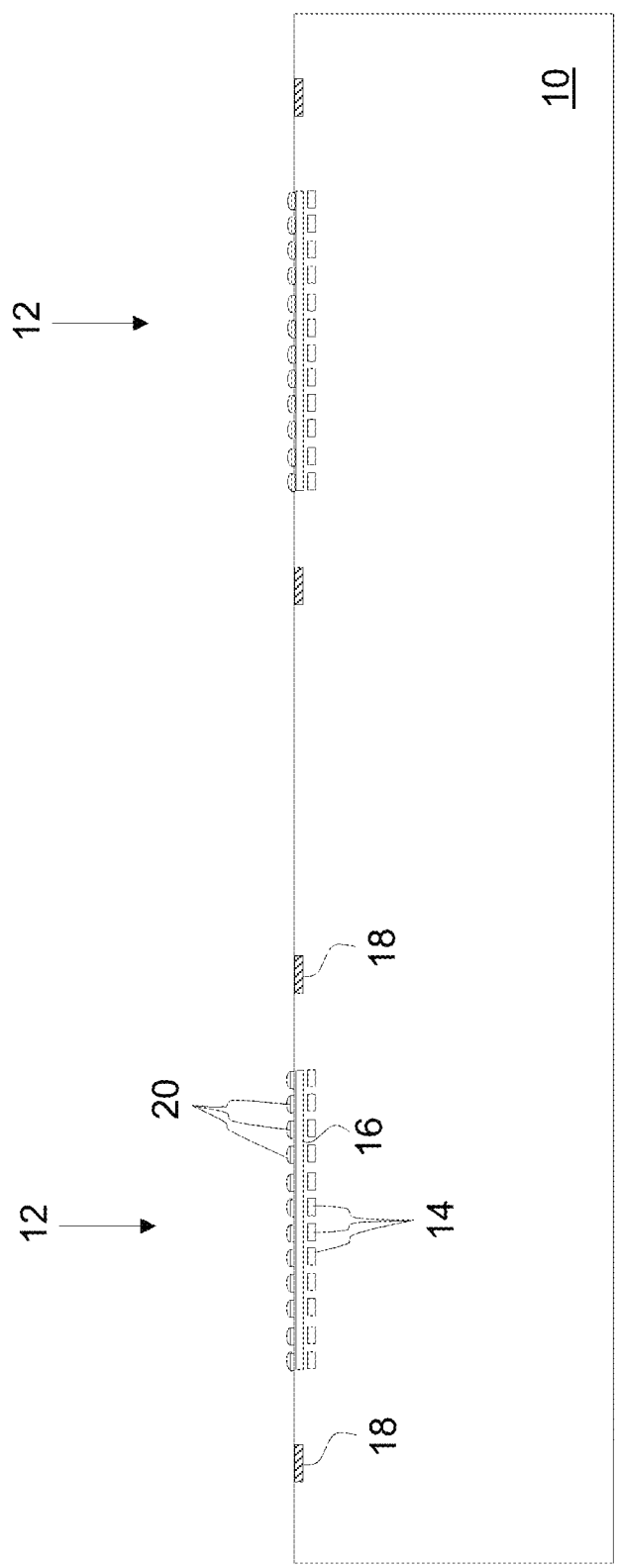

US 9,219,091 B2

LOW PROFILE SENSOR MODULE AND METHOD OF MAKING SAME

RELATED APPLICATIONS

This application claims the benefit of U.S. Provisional Application No. 61/778,238, filed Mar. 12, 2013, and which is incorporated herein by reference.

FIELD OF THE INVENTION

The present invention relates to packaging of microelectronic devices, and more particularly to a packaging of optical semiconductor devices.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution).

There are different driving forces behind the development of wafer level packaging solutions for image sensors. For example, reduced form factor (i.e. increased density for achieving the highest capacity/volume ratio) overcomes space limitations and enables smaller camera module solutions. Increased electrical performance can be achieved with shorter interconnect lengths, which improves electrical performance and thus device speed, and which strongly reduces chip power consumption. Heterogeneous integration allows for the integration of different functional layers (e.g. the integration of high and low resolution images sensors, the integration of the image sensor with its processor, etc.).

Presently, chip-on-board (COB—where the bare chip is mounted directly on a printed circuit board) and Shellcase Wafer Level CSP (where the wafer is laminated between two sheets of glass) are the dominant packaging and assembly processes used to build image sensor modules (e.g. for mobile device cameras, optical mice, etc.). However, as higher pixel image sensors are used, COB and Shellcase WLCSP assembly becomes increasingly difficult due to assembly limitations, size limitations (the demand is for lower profile devices), yield problems and the capital investment for packaging 8 and 12 inch image sensor wafers.

There is a need for an improved package and packaging technique that provides a low profile packaging solution that is cost effective and reliable (i.e. provides the requisite mechanical support and electrical connectivity).

BRIEF SUMMARY OF THE INVENTION

An image sensor package includes a host substrate assembly and a sensor chip. The host substrate assembly includes a first substrate with opposing first and second surfaces, an aperture extending through the first substrate between the first and second surfaces, one or more circuit layers, and a plurality of first contact pads electrically coupled to the one or more circuit layers. The sensor chip includes a second substrate with opposing first and second surfaces, a plurality of photo detectors formed on or in the second substrate and configured to receive light incident on the first surface of the second substrate, and a plurality of second contact pads formed at the first surface or the second surface of the second substrate and which are electrically coupled to the photo detectors. A spacer is mounted to the first surface of the second substrate. A protective substrate is mounted to the spacer and disposed over the plurality of photo detectors. A plurality of electrical conduits are each formed of electrically conductive material and extend through the spacer and are in electrical contact with one of the second contact pads. Electrical connectors are each electrically connecting one of the first contact pads and one of the electrical conduits.

In another aspect of the image sensor package, it includes a host substrate assembly and a sensor chip. The host substrate assembly includes a first substrate with opposing first and second surfaces, an aperture extending through the first substrate between the first and second surfaces, one or more circuit layers, and a plurality of first contact pads electrically coupled to the one or more circuit layers. The sensor chip includes a second substrate with opposing first and second surfaces, a plurality of photo detectors formed on or in the second substrate and configured to receive light incident on the first surface of the second substrate, and a plurality of second contact pads formed at the first surface or the second surface of the second substrate and which are electrically coupled to the photo detectors. A protective substrate is mounted to the second substrate, wherein the protective substrate includes a cavity formed into a surface thereof which is disposed over the plurality of photo detectors. A plurality of electrical conduits are each formed of electrically conductive material that extends through the protective substrate and is in electrical contact with one of the second contact pads. Electrical connectors are each electrically connecting one of the first contact pads and one of the electrical conduits.

A method of forming an image sensor package includes providing a first substrate that includes opposing first and second surfaces, an aperture extending through the first substrate between the first and second surfaces, one or more circuit layers, and a plurality of first contact pads electrically coupled to the one or more circuit layers; providing a sensor chip that includes a second substrate with opposing first and second surfaces, a plurality of photo detectors formed on or in the second substrate and configured to receive light incident on the first surface of the second substrate, and a plurality of second contact pads formed at the first surface or the second surface of the second substrate and which are electrically coupled to the photo detectors; mounting a spacer to the first surface of the second substrate; mounting a protective substrate to the spacer wherein the protective substrate is disposed over the plurality of photo detectors; forming a plurality of electrical conduits of electrically conductive material each of which extending through the spacer and in electrical contact with one of the second contact pads; and forming electrical connectors each electrically connecting one of the first contact pads and one of the electrical conduits.

In another aspect of the method of forming an image sensor package, it includes providing a first substrate that includes opposing first and second surfaces, an aperture extending through the first substrate between the first and second surfaces, one or more circuit layers, and a plurality of first contact pads electrically coupled to the one or more circuit layers; providing a sensor chip that includes a second substrate with opposing first and second surfaces, a plurality of photo detectors formed on or in the second substrate and configured to receive light incident on the first surface of the second substrate, and a plurality of second contact pads formed at the first surface or the second surface of the second substrate and which are electrically coupled to the photo detectors; mounting a protective substrate to the second substrate, wherein the protective substrate includes a cavity formed into a surface thereof which is disposed over the plurality of photo detectors; forming a plurality of electrical conduits of electrically conductive material each of which extending through the protective substrate and in electrical contact with one of the second contact pads; and forming electrical connectors each electrically connecting one of the first contact pads and one of the electrical conduits.

Other objects and features of the present invention will become apparent by a review of the specification, claims and appended figures.

BRIEF DESCRIPTION OF THE DRAWINGS

FIGS. 1A-1F are cross sectional side views showing in sequence the steps in forming the image sensor assembly.

DETAILED DESCRIPTION OF THE INVENTION

The present invention relates to camera modules and packaging of microelectronic image sensor devices, and more particularly to the forming a low profile chip scale camera module that includes a low profile wafer level packaged image sensor.

Figure 1B:
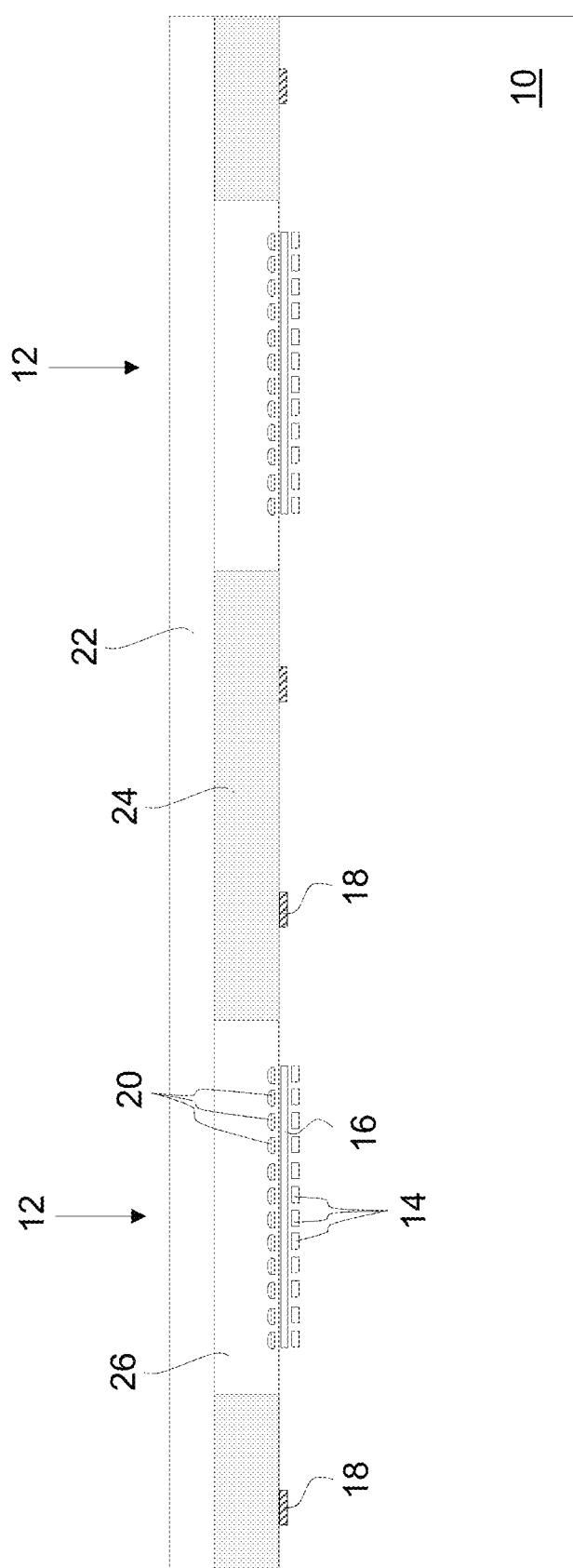

FIGS. 1A-1F illustrate the formation of the packaged image sensor. The formation begins with a wafer 10 (substrate) containing multiple image sensors 12 formed thereon, as illustrated in FIG. 1A. Each image sensor 12 includes a plurality of photo detectors 14, supporting circuitry 16, and contact pads 18. The contact pads 18 are electrically connected to the photo detectors 14 and/or their supporting circuitry 16 for providing off chip signaling. Each photo detector 14 converts light energy to a voltage signal. Additional circuitry may be included to amplify the voltage, and/or convert it to digital data. Color filters and/or microlenses 20 can be mounted over the photo detectors 14. Sensors of this type are well known in the art, and not further described herein.

A protective substrate 22 is mounted over substrate 10 via spacers 24. Preferably, the substrate 22 and spacers 24 form cavities 26 that each separately encapsulates one of the sensors 12. Cavities 26 are preferably large enough to cover the entire active sensor area of each sensor 12, but do not extend over the contact pads 18. The protective substrate 22 and spacers 24 are bonded on the active side of the image sensor substrate 10 by epoxy, polymer, resin or any other appropriate bonding adhesive(s) and method(s). Substrate 22 can be a polymer, glass, a composite of glass and polymer, or any other optically transparent material(s). Preferably, the substrate 22 is glass with a thickness in range of 50 to 1000 µm. Spacers 24 can be made of epoxy, polymer, resin, glass, solder mask or any other appropriate material(s) with a preferred height of in range of 5 to 500 µm. The resulting structure is shown in FIG. 1B.

Figure 1C:
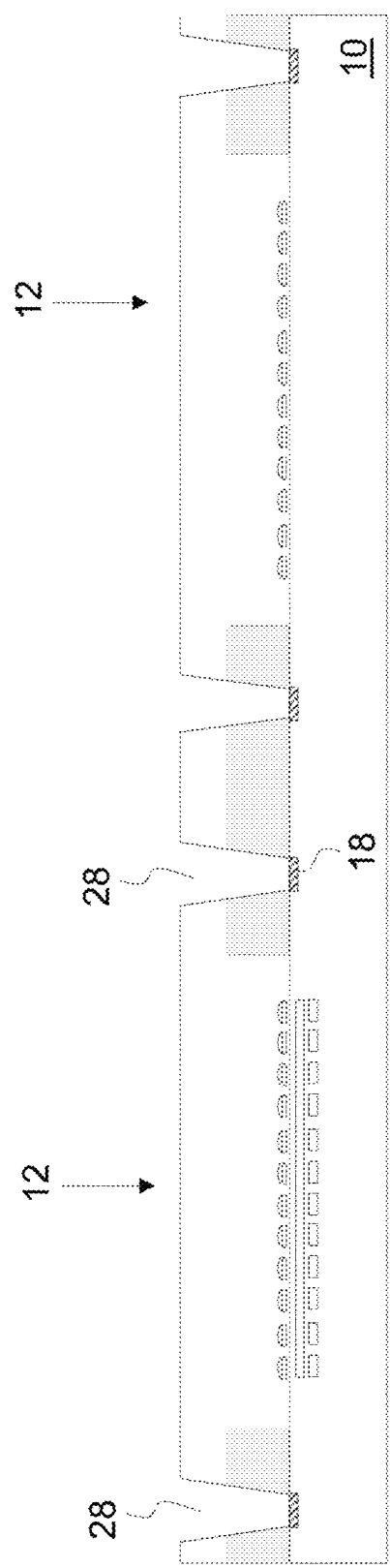

Silicon thinning can be done by mechanical grinding, chemical mechanical polishing (CMP), wet etching, atmospheric downstream plasma (ADP), dry chemical etching (DCE), and a combination of aforementioned processes or any another appropriate silicon thinning method(s) to reduce the thickness of substrate 10. A non-limiting example of the thinned thickness of substrate 10 is in the range of 50 to 500 µm, such as approximately 200 µm. Via holes 28 are then formed into the top surface of substrate 22 and extend all the way through substrate 22 and through spacers 24 to expose contact pads 18. Via holes 28 can be made by photolithography followed by plasma etch, laser drill, wet etch or any another appropriate VIA forming method(s). Preferably, laser drilling is used, and the bottom of the VIA holes 28 are no larger than the contact pads 18 so that no portion of the silicon of substrate 10 is exposed. The top openings of the VIA holes 28 are preferably larger than their bottom openings, creating a funnel shape for each Via hole 28. The resulting structure is shown in FIG. 1C.

Figure 1D:
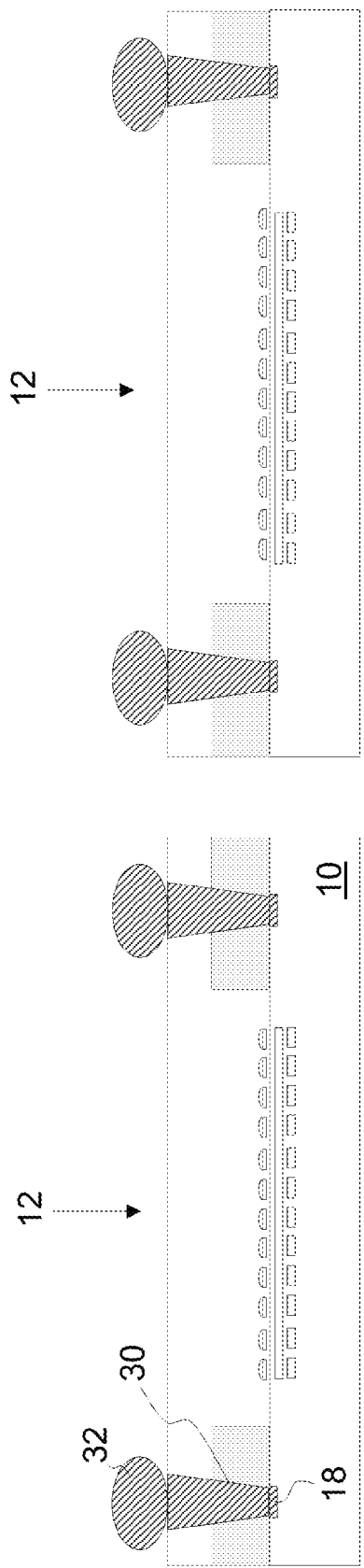

The VIA holes 28 are filled or lined with a conductive material 30, such as silver, copper, aluminum, gold, conductive polymer, conductive adhesive, a combination of aforementioned materials or any other appropriate conductive material(s). The conductive material 30 can be deposited into the VIA holes 28 by PVD (physical vapor deposition), plating, screen printing or any other appropriate dispensing method(s). The conductive material 30 forms electrical conduits each extending through the protective substrate 22 and spacer 24. Electrical interconnects 32 are then formed or deposited on the conductive material 30. Interconnects 32 can be BGA, stud bump, plated bump, conductive polymer bump, copper pillar, micro-post or any other appropriate interconnecting structure. Alternately, interconnects 30 can be formed adjacent to via holes 28 in a manner where they are in electrical contact with the conductive material 30. Wafer level dicing/singulation of components can be done with mechnical blade dicing equipment, laser cutting or any other apporiate processes to separate each image sensor 12 into separate die. The resulting structure is shown in FIG. 1D.

Figure 1E:
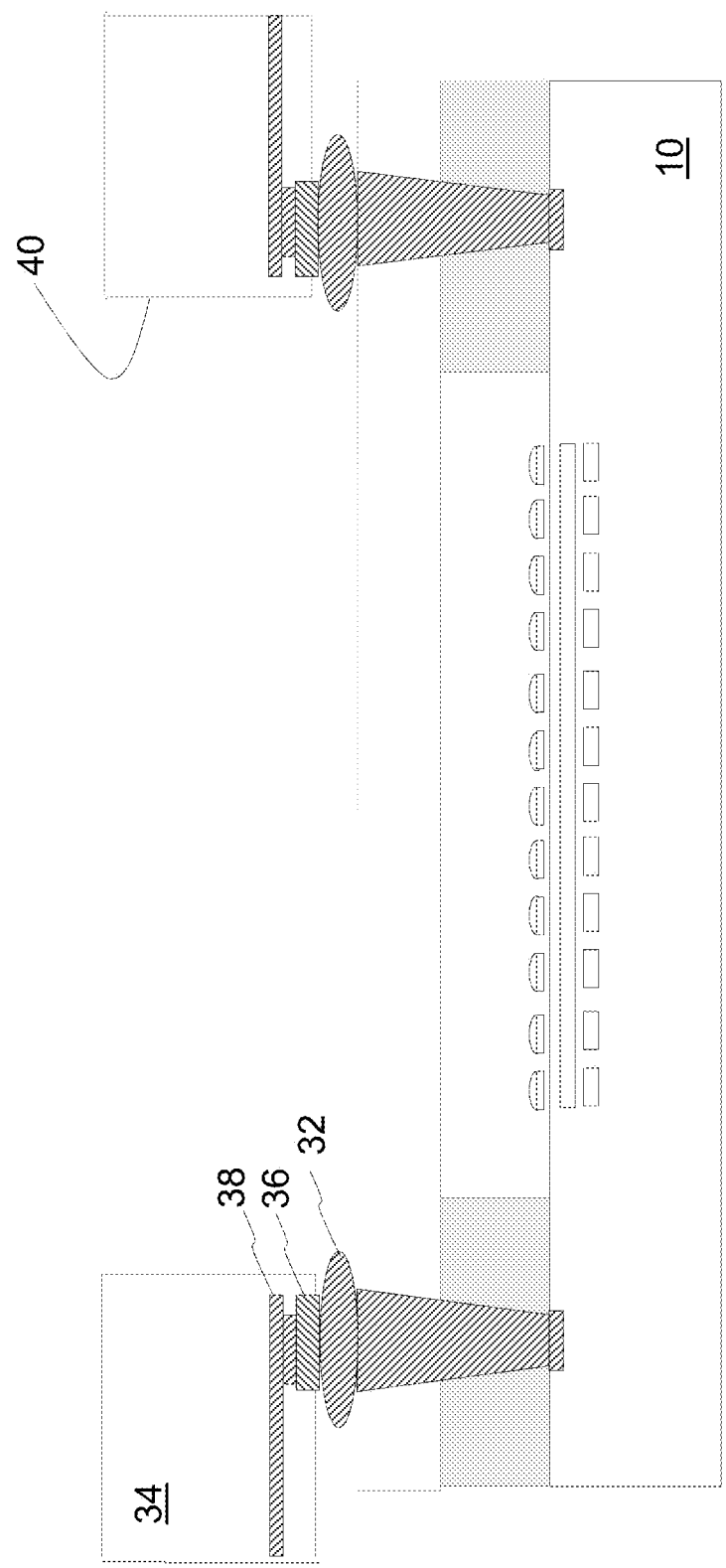

The singulated packaged sensor die can then be mounted via interconnects 32 to a host substrate 34 having contact pads 36, circuitry layers 38 and an aperture 40 that is positioned over image sensor 12, as shown in FIG. 1E. The host substrate 34 can be an organic Flex PCB, FR4 PCB, silicon (rigid), glass, ceramic or any other type of appropriate substrate.

Figure 1F:
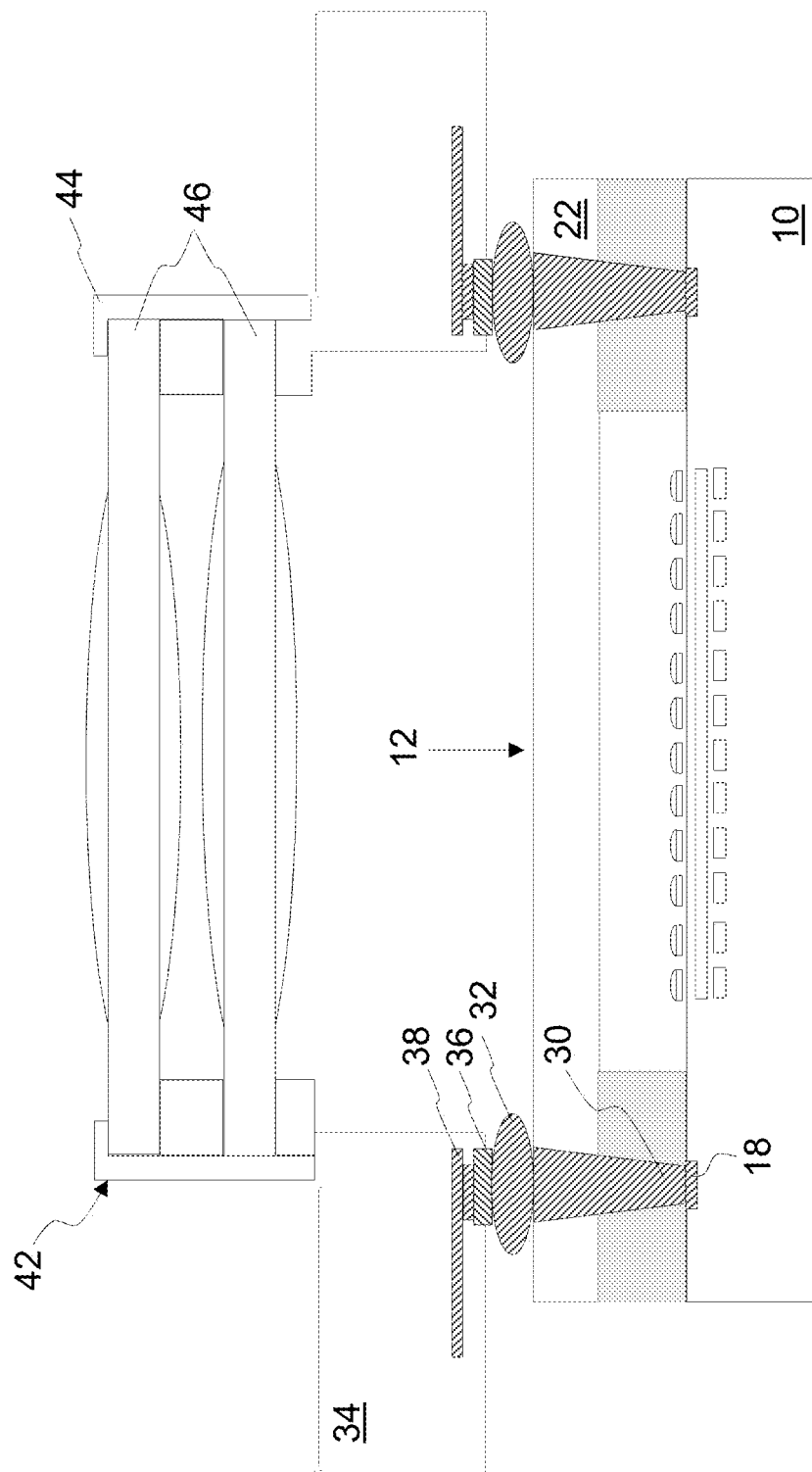

A lens module 42 may be mounted over the sensor 12, as illustrated in FIG. 1F. An exemplary lens module 42 can include a housing 44 bonded to the host substrate 34, where the housing 44 supports one or more lenses 46 over the sensor 12. With this final structure, the image sensor 12 is secured to one side of host substrate 34 by interconnects 32, and lens module 42 is secured to the other side of the host substrate 34, where the lens module focuses incoming light through aperture 40, through protective substrate 22, and onto photo detectors 14. Protective substrate 22 protects image sensor 12 from contamination. Conductive material 30 electrically connects contact pads 18 to interconnects 32, which in turn are electrically connected to contact pads 36 and circuit layers 38 of host substrate 34.

Figure 2A:
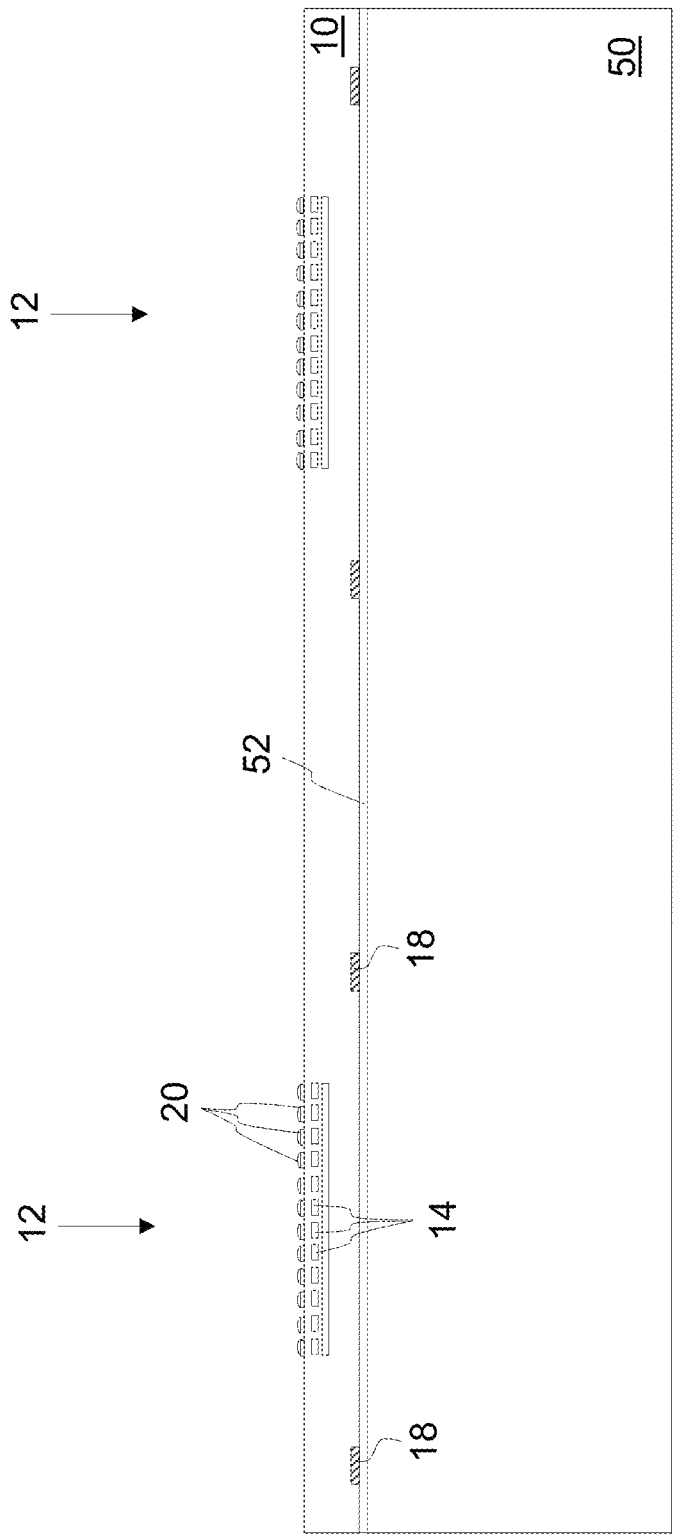
FIGS. 2A-2D are cross sectional side views showing in sequence the steps in forming an alternate embodiment of the image sensor assembly.

FIGS. 2A-2D illustrate the formation of an alternate embodiment of the packaged image sensor. The formation begins with the same structure as illustrated in FIG. 1A, except the contact pads 18 are located on the opposite surface of the substrate 10 on which light is incident. This configuration could include back side illuminated sensor devices (BSI) where the photo detectors 14 are formed adjacent the opposite surface of the substrate as the contact pads 18 or the photo detectors are configured to detect light entering the substrate 10 through that opposite surface. The substrate 10 is mounted to a support substrate 50 using an appropriate adhesive 52, as shown in FIG. 2A. The sensors are then encapsulated by protective substrate 22 and spacers 24, and the support substrate 50 thinned, by the same techniques described above with respect to FIGS. 1B and 1C, to result in the structure shown in FIG. 2B.

The via holes 28 are then formed, as explained above with respect to FIG. 1C, into the top surface of substrate 22 and extend all the way through substrate 22 and through spacers 24. Additionally, the via holes 28 are extended through substrate 10 to expose contact pads 18 by an additional silicon etch. The sidewalls of the VIA holes 28 are lined with an insulation layer 54 such as polyimide, ceramics, polymer, polymer composite, parylene, silicon oxide, epoxy, silicone, nitrides, glass, resin, and/or a combination of aforementioned materials or any other appropriate dielectric material(s). Preferably, insulation layer 54 is silicon dioxide, and is formed by depositing the layer of material 54 over the entire structure, followed by the deposition of a photo resist layer. The photo resist layer is patterned by photolithography to remove the photo resist layer except for the side surfaces of via holes 28, leaving the remainder of layer 54 exposed (i.e. on the horizontal surfaces). An etch is used to remove the exposed portions of layer 54, leaving the structure shown in FIG. 2C (after removal of the photo resist).

Figure 2B:
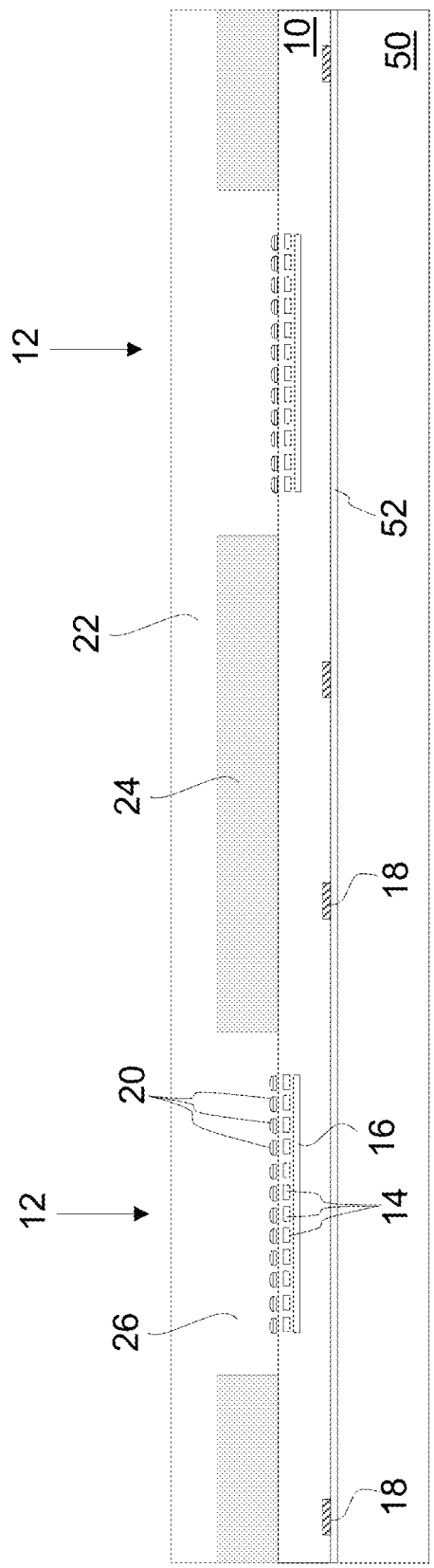
Figure 2C:
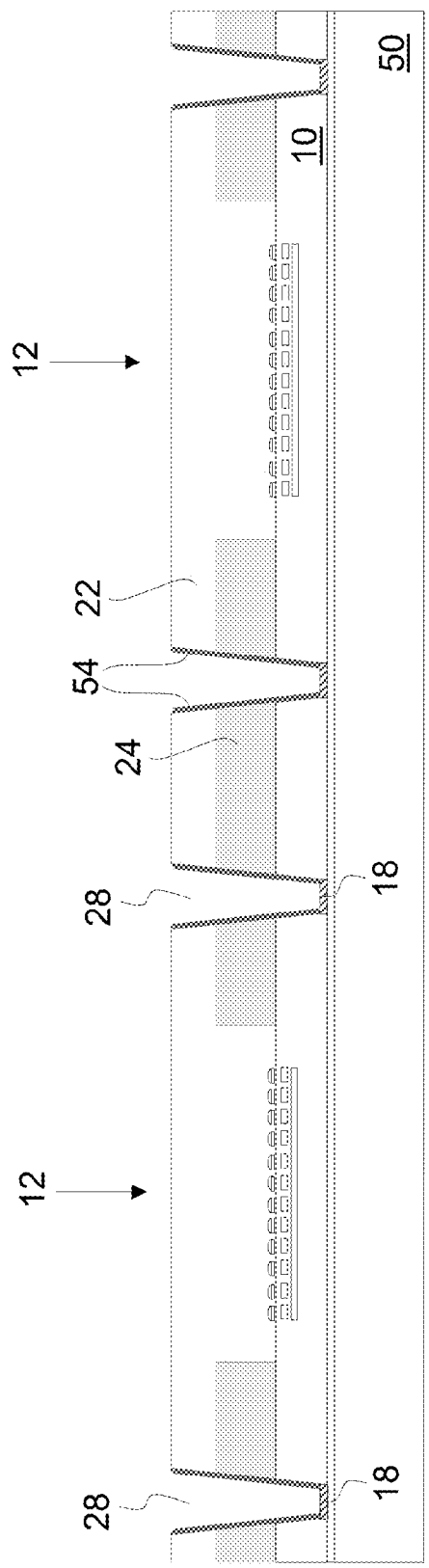
Figure 2D:
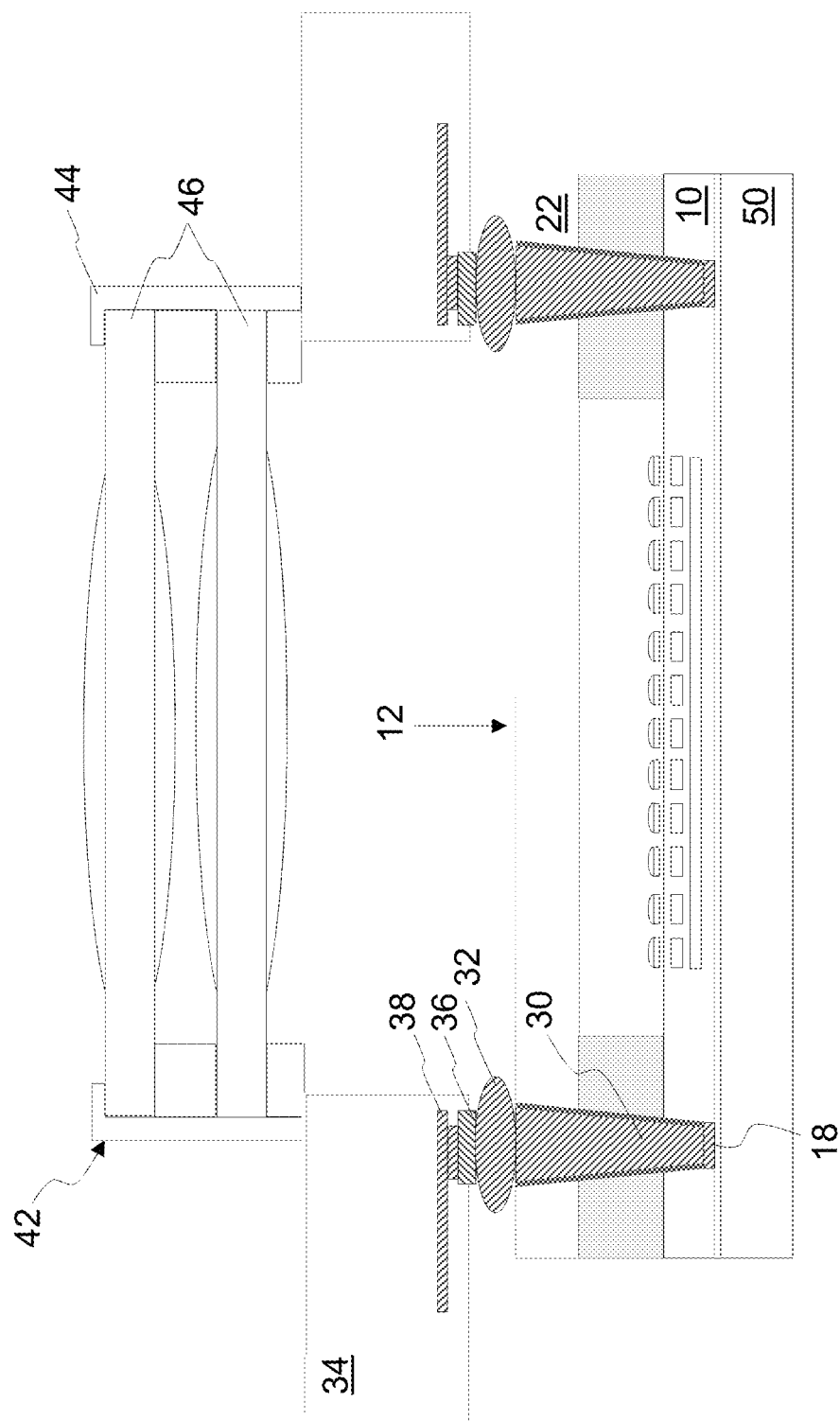

The processing steps discussed above with respect to FIGS. 1D-1F are next performed (i.e. to form conductive material 30 and interconnects 32, to singulate the die, to mount to host substrate 34, and to include lens module 42), which results in the structure shown in FIG. 2D.

Figure 3A:
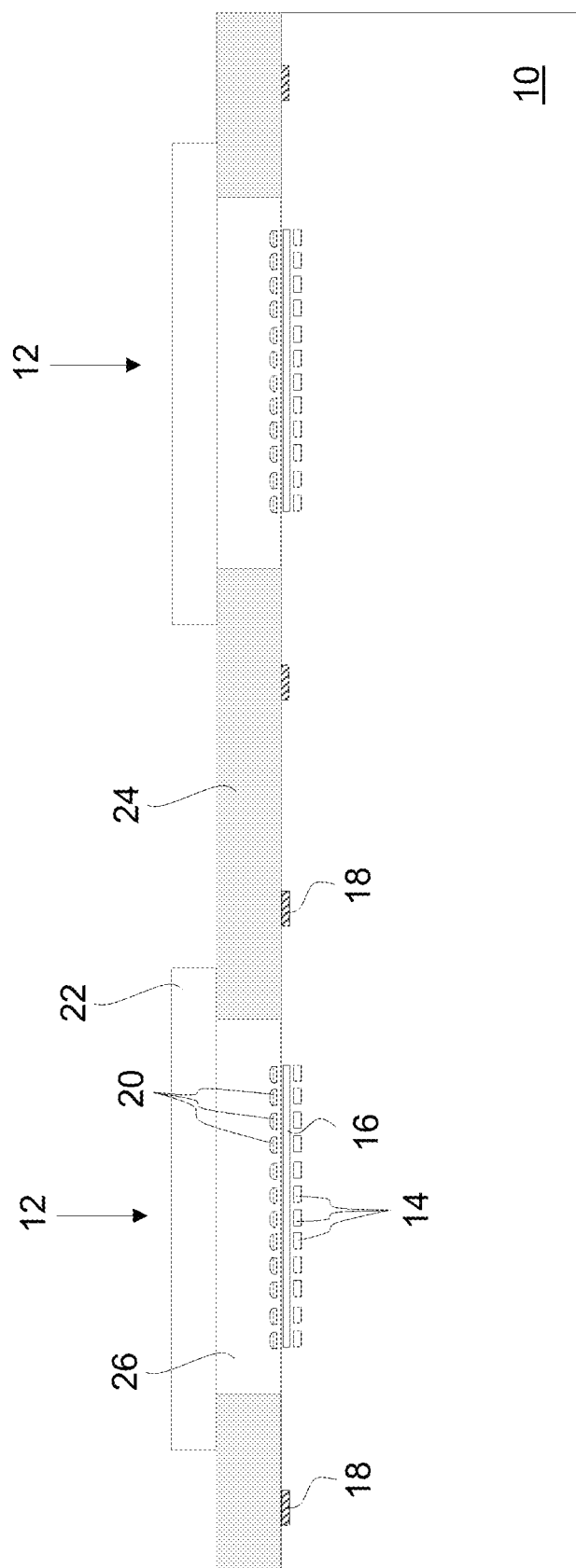
FIGS. 3A-3B are cross sectional side views showing in sequence the steps in forming a second alternate embodiment of the image sensor assembly.
Figure 3B:
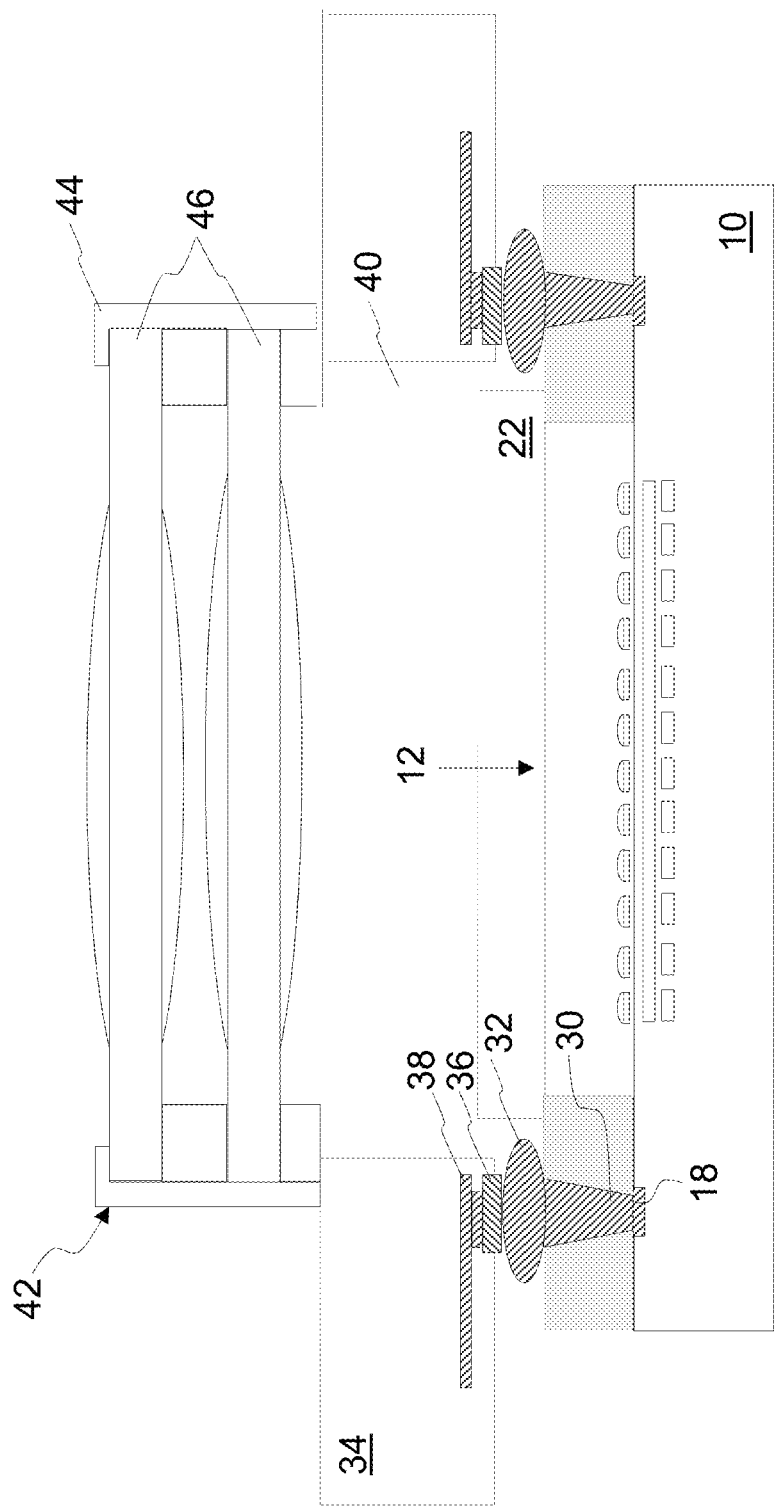

FIGS. 3A and 3B illustrate the formation of a second alternate embodiment of the packaged image sensor, where the via holes 28 and conductive material 30 are not formed through the protective substrate 22. The formation begins with the same structure as illustrated in FIG. 1B. After silicon thinning of the substrate 10, the portions of protective substrate 22 over the contact pads 18 are cut and removed, preferably by using laser cutting equipment, mechanical sawing, and a combination of aforementioned processes or any other appropriate glass cutting method(s), as illustrated in FIG. 3A. Laser cutting is the preferred method, and exposes portions of spacers 24 over the contact pads 18.

The via holes 28 are formed through the spacers 24 to expose the contact pads 18 in a similar manner as described above with respect to FIG. 1C. The processing steps as described above with respect to FIGS. 1D-1F are then performed, to result in the structure shown in FIG. 3B. The overall thickness of this embodiment can be less than that of FIG. 1F because the protective substrate 22 can at least partially protrude into the aperture 40.

Figure 4:
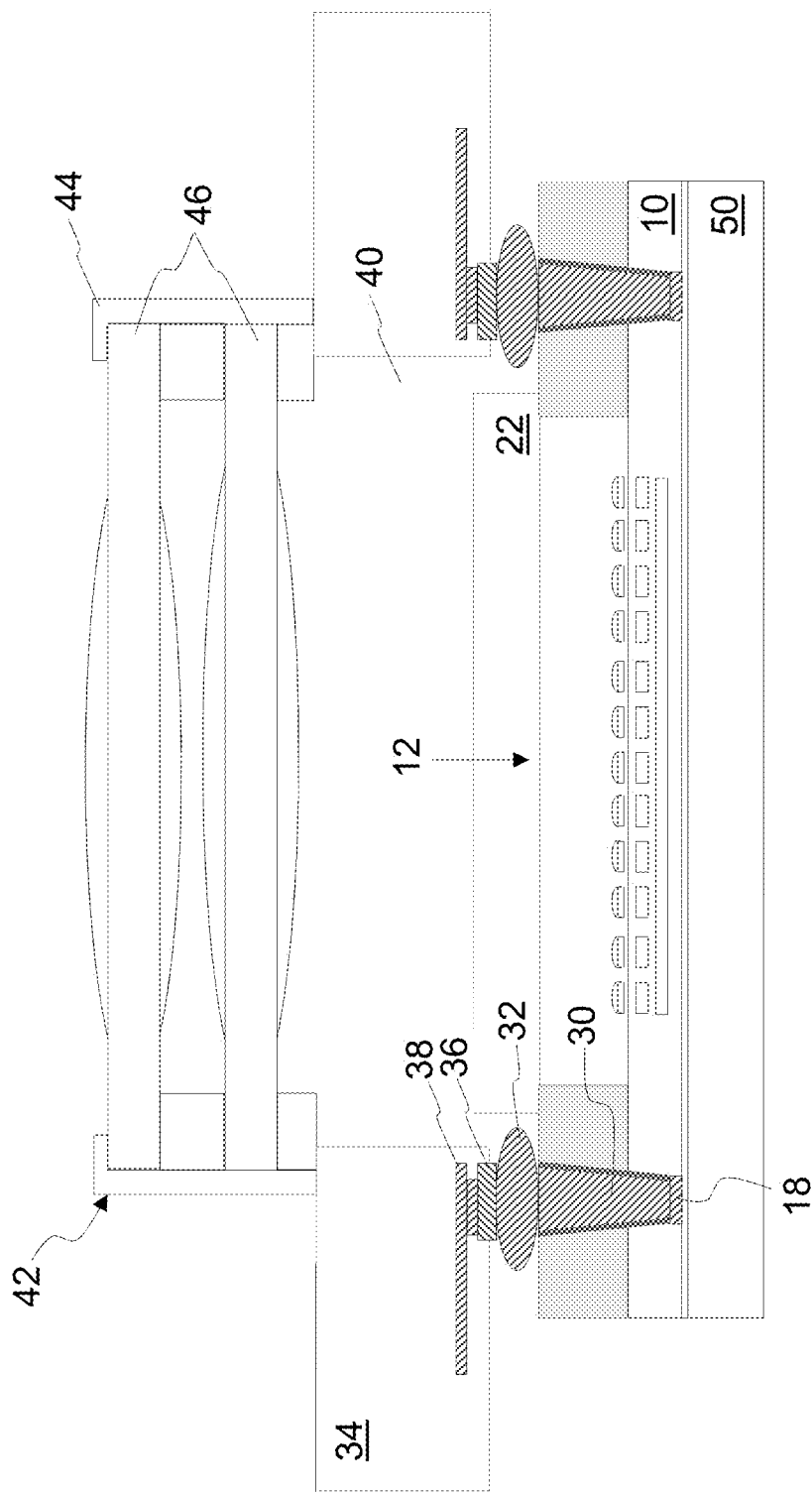
FIG. 4 is a cross sectional side view showing a third alternate embodiment of the image sensor assembly.

FIG. 4 illustrates a third alternate embodiment of the packaged image sensor, where the cutting of the protective substrate 22 as described above with respect to FIG. 3A is applied the structure of FIG. 2B, before the remaining processing steps described above with respect to FIGS. 2C-2D are performed. The overall thickness of this embodiment can be less than that of FIG. 2D because the protective substrate 22 can at least partially protrude into the aperture 40.

Figure 5:
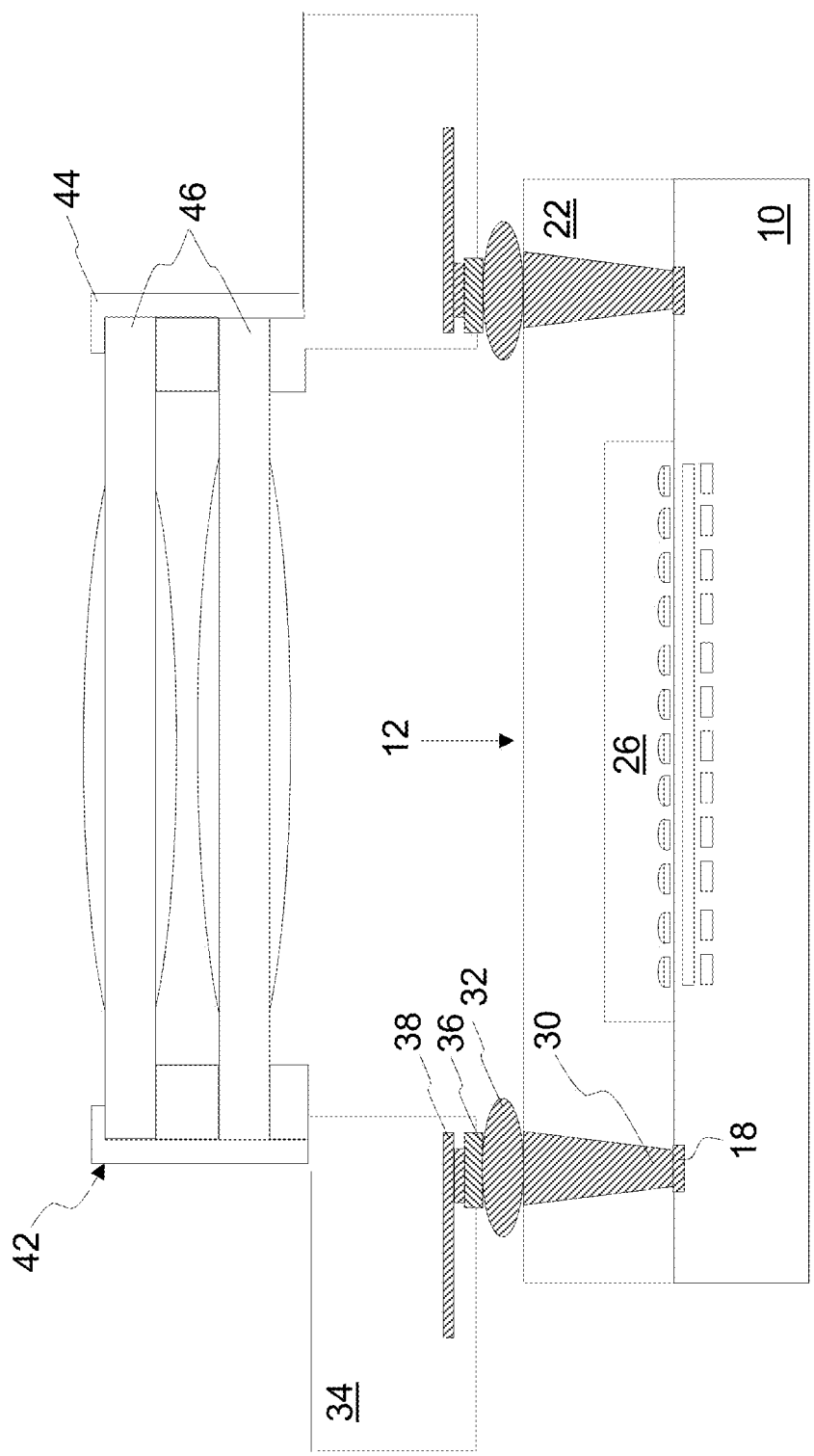
FIG. 5 is a cross sectional side view showing a fourth alternate embodiment of the image sensor assembly.
Figure 6:
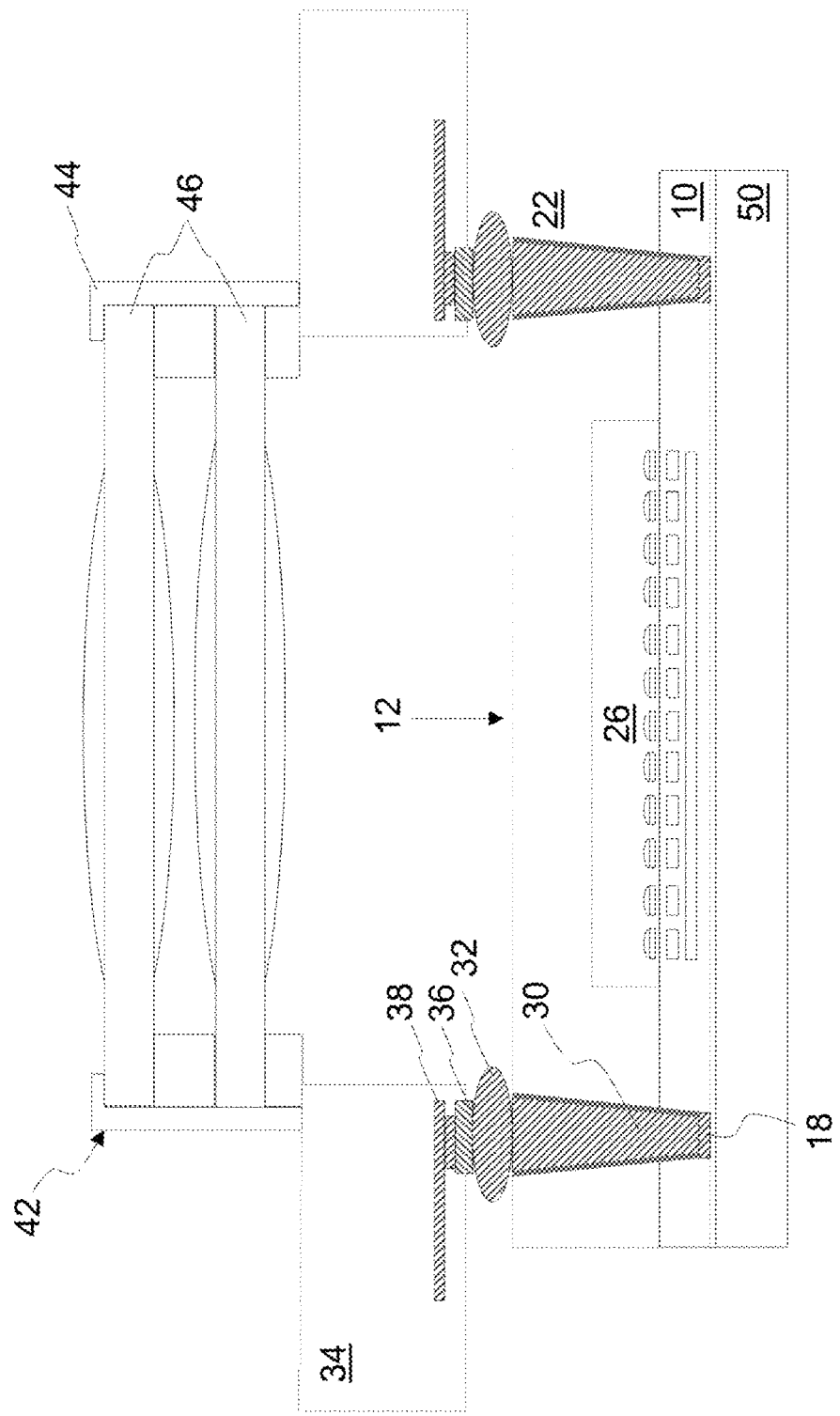
FIG. 6 is a cross sectional side view showing a fifth alternate embodiment of the image sensor assembly.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the packaged image sensor. For each sensor die, spacer 24 can be a single element or a plurality of discrete spacer elements. Alternately, spacer 24 can be omitted from the embodiments of FIGS. 1F and 2D, and instead cavities 26 can be formed into the bottom surface of substrate 22 (e.g. by photolithography etching), as illustrated in FIGS. 5 and 6 respectively, where via holes 28 and conductive material 30 are formed through substrate 22. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An image sensor package, comprising:
   a host substrate assembly including:
   a first substrate with opposing first and second surfaces,
   an aperture extending through the first substrate between the first and second surfaces,
   one or more circuit layers,
   a plurality of first contact pads electrically coupled to the one or more circuit layers;
   a sensor chip that includes:
   a second substrate with opposing first and second surfaces,
   a plurality of photo detectors formed on or in the second substrate and configured to receive light incident on the first surface of the second substrate, and
   a plurality of second contact pads formed at the first surface of the second substrate and which are electrically coupled to the photo detectors;
   a spacer mounted to the first surface of the second substrate;
   a protective substrate mounted to the spacer and disposed over the plurality of photo detectors;
   a plurality of electrical conduits each formed of electrically conductive material that extends through the spacer and is in electrical contact with one of the second contact pads; and
   electrical connectors each electrically connecting one of the first contact pads and one of the electrical conduits.

2. The image sensor package of claim 1, wherein each of the electrical conduits has a funnel shaped cross section.

3. The image sensor package of claim 1, wherein each of the electrical conduits also extends through the protective substrate.

4. The image sensor package of claim 1, wherein the protective substrate is at least partially disposed in the aperture.

5. The image sensor package of claim 1, further comprising:
- a lens module mounted to the host substrate assembly, wherein the lens module includes one or more lenses disposed for focusing light through the aperture and onto the photo detectors.

6. The image sensor package of claim 5, wherein:
- the lens module is mounted to the first surface of the first substrate; and
- the first contact pads are disposed at the second surface of the first substrate.

7. An image sensor package comprising:
- a host substrate assembly including:
  - a first substrate with opposing first and second surfaces,
  - an aperture extending through the first substrate between the first and second surfaces,
  - one or more circuit layers,
  - a plurality of first contact pads electrically coupled to the one or more circuit layers;
- a sensor chip that includes:
  - a second substrate with opposing first and second surfaces,
  - a plurality of photo detectors formed on or in the second substrate and configured to receive light incident on the first surface of the second substrate, and
  - a plurality of second contact pads formed at the second surface of the second substrate and which are electrically coupled to the photo detectors;
- a spacer mounted to the first surface of the second substrate;
- a protective substrate mounted to the spacer and disposed over the plurality of photo detectors;
- a plurality of electrical conduits each formed of electrically conductive material that extends through the spacer and is in electrical contact with one of the second contact pads; and
- electrical connectors each electrically connecting one of the first contact pads and one of the electrical conduits;
- wherein each of the electrical conduits also extends through and is insulated from at least a portion of the second substrate, and wherein each of the electrical conduits also extends through the protective substrate.

8. The image sensor package of claim 7, further comprising:
- a support substrate mounted to the second surface of the second substrate.

9. The image sensor package of claim 7, wherein the protective substrate is at least partially disposed in the aperture.

10. An image sensor package, comprising:
- a host substrate assembly including:
  - a first substrate with opposing first and second surfaces,
  - an aperture extending through the first substrate between the first and second surfaces,
  - one or more circuit layers,
  - a plurality of first contact pads electrically coupled to the one or more circuit layers;
- a sensor chip that includes:
  - a second substrate with opposing first and second surfaces,
  - a plurality of photo detectors formed on or in the second substrate and configured to receive light incident on the first surface of the second substrate, and
  - a plurality of second contact pads formed at the first surface or the second surface of the second substrate and which are electrically coupled to the photo detectors;
- a protective substrate mounted to the second substrate, wherein the protective substrate includes a cavity formed into a surface thereof which is disposed over the plurality of photo detectors;
- a plurality of electrical conduits each formed of electrically conductive material that extends through the protective substrate and is in electrical contact with one of the second contact pads; and
- electrical connectors each electrically connecting one of the first contact pads and one of the electrical conduits.

11. The image sensor package of claim 10, further comprising:
- a lens module mounted to the host substrate assembly, wherein the lens module includes one or more lenses disposed for focusing light through the aperture and onto the photo detectors.

12. The image sensor package of claim 10, wherein:
- the lens module is mounted to the first surface of the first substrate; and
- the first contact pads are disposed at the second surface of the first substrate.

13. The image sensor package of claim 10, wherein each of the electrical conduits has a funnel shaped cross section.

14. The image sensor package of claim 10, wherein the second contact pads are formed at the first surface of the second substrate.

15. The image sensor package of claim 10, wherein the second contact pads are formed at the second surface of the second substrate, and wherein each of the electrical conduits also extends through and is insulated from at least a portion of the second substrate.

16. The image sensor package of claim 15, further comprising:
- a support substrate mounted to the second surface of the second substrate.

17. A method of forming an image sensor package, comprising:
- providing a first substrate that includes opposing first and second surfaces, an aperture extending through the first substrate between the first and second surfaces, one or more circuit layers, and a plurality of first contact pads electrically coupled to the one or more circuit layers;
- providing a sensor chip that includes a second substrate with opposing first and second surfaces, a plurality of photo detectors formed on or in the second substrate and configured to receive light incident on the first surface of the second substrate, and a plurality of second contact pads formed at the first surface of the second substrate and which are electrically coupled to the photo detectors;
- mounting a spacer to the first surface of the second substrate;
- mounting a protective substrate to the spacer wherein the protective substrate is disposed over the plurality of photo detectors;
- forming a plurality of electrical conduits of electrically conductive material each of which extending through the spacer and in electrical contact with one of the second contact pads;
- forming electrical connectors each electrically connecting one of the first contact pads and one of the electrical conduits.

18. The method of claim 17, further comprising:
mounting a lens module to the first substrate, wherein the lens module includes one or more lenses disposed for focusing light through the aperture and onto the photo detectors.

19. The method of claim 17, wherein the forming of the plurality of electrical conduits further comprises forming each of the electrical conduits to extend through the protective substrate.

20. A method of forming an image sensor package, comprising:
providing a first substrate that includes opposing first and second surfaces, an aperture extending through the first substrate between the first and second surfaces, one or more circuit layers, and a plurality of first contact pads electrically coupled to the one or more circuit layers;
providing a sensor chip that includes a second substrate with opposing first and second surfaces, a plurality of photo detectors formed on or in the second substrate and configured to receive light incident on the first surface of the second substrate, and a plurality of second contact pads formed at the first surface or the second surface of the second substrate and which are electrically coupled to the photo detectors;
mounting a protective substrate to the second substrate, wherein the protective substrate includes a cavity formed into a surface thereof which is disposed over the plurality of photo detectors;
forming a plurality of electrical conduits of electrically conductive material each of which extending through the protective substrate and in electrical contact with one of the second contact pads;
forming electrical connectors each electrically connecting one of the first contact pads and one of the electrical conduits.

21. The method of claim 20, further comprising:
mounting a lens module to the first substrate, wherein the lens module includes one or more lenses disposed for focusing light through the aperture and onto the photo detectors.

22. The method of claim 20, wherein the second contact pads are formed at the first surface of the second substrate.

23. The method of claim 20, wherein the second contact pads are formed at the second surface of the second substrate, and wherein the forming of the plurality of electrical conduits further comprises forming each of the electrical conduits to extend through and be insulated from at least a portion of the second substrate.

* * * * *